United States Patent
Mahrize

(10) Patent No.: US 8,309,842 B2
(45) Date of Patent: Nov. 13, 2012

(54) METHOD AND DEVICE OF DIAMOND LIKE CARBON MULTI-LAYER DOPING GROWTH

(75) Inventor: Moshe Mahrize, Holon (IL)

(73) Assignee: Burning Solar Ltd., Holon (IL)

( * ) Notice: Subject to any disclaimer, the term of this patent is extended or adjusted under 35 U.S.C. 154(b) by 502 days.

(21) Appl. No.: 12/525,918

(22) PCT Filed: Feb. 13, 2008

(86) PCT No.: PCT/IL2008/000189
§ 371 (c)(1),
(2), (4) Date: Aug. 24, 2009

(87) PCT Pub. No.: WO2008/099394
PCT Pub. Date: Aug. 21, 2008

(65) Prior Publication Data
US 2010/0024873 A1    Feb. 4, 2010

Related U.S. Application Data

(60) Provisional application No. 60/901,033, filed on Feb. 13, 2007.

(51) Int. Cl.
*H01L 31/04* (2006.01)
*H01L 31/0312* (2006.01)

(52) U.S. Cl. .................. 136/255; 257/E31.061; 438/73
(58) Field of Classification Search ................ 136/255; 257/E31.061; 438/73
See application file for complete search history.

(56) References Cited

U.S. PATENT DOCUMENTS

| 4,513,168 A | 4/1985 | Borden |
| 5,206,534 A | 4/1993 | Birkle et al. |
| 5,366,556 A | 11/1994 | Prince et al. |
| 5,562,781 A | 10/1996 | Ingram et al. |
| 6,078,133 A | 6/2000 | Menu et al. |
| 7,214,600 B2 | 5/2007 | Won et al. |
| 2003/0022072 A1* | 1/2003 | Campi et al. ............ 430/5 |
| 2006/0078677 A1 | 4/2006 | Won |
| 2007/0042667 A1 | 2/2007 | Sung |

OTHER PUBLICATIONS

Ph.D. Dissertation, "Surface Characterization of Amorphous Hydrogenated Carbon Thin Films Containing Nanoclusters of Noble Metals"; Jul. 2003, Ivan R. Videnovic, 101 pages.
Aisenberg, S., Kimock, F. M., "Ion Beam and Ion-Assisted Deposition of Diamond-Like Carbon Films"; Mater. Sci. Forum, 52-53, (1988), 1 (41 pages).
J. Robertson, "Amorphous carbon"; Adv. Phys., 35 (1986), 317-74.
C. Benndorf, M. Grischke, A. Brauer and F. Thieme, "Identification of Carbon and Tantalum Chemical States in Metal-Doped a-C:H Films"; Surf. Coat. Technol., 36 (1988), 171, (11 pages).

* cited by examiner

*Primary Examiner* — Mamadou Diallo
(74) *Attorney, Agent, or Firm* — Roach Brown McCarthy & Gruber, P.C.; Kevin D. McCarthy

(57) ABSTRACT

A method of a:DLC multi-layer doping growth comprising the steps of: forming a plurality of a:DLC layers in one process, thereby creating a plurality of successively connected PIN junctions, starting from a first junction and ending in a last junction, respective PIN junctions having p-type, n-type, and intrinsic layers; varying the sp3/sp2 ratio of at least the respective p-type and n-type layers and doping with at least silver to enhance electron mobility in respective PIN junctions; and connecting the plurality of a:DLC layers between electrodes at the first side and the second side to create a device having optimized spectral response to being oriented to a light source.

18 Claims, 2 Drawing Sheets

“METHOD AND DEVICE OF DIAMOND LIKE CARBON MULTI-LAYER DOPING GROWTH”

This application claims priority from U.S. Provisional Patent Application No. 60/901,033 filed 13 Feb. 2007, incorporated herein by reference.

FIELD AND BACKGROUND OF THE INVENTION

The present invention relates to a method and device of amorphous diamond like carbon thin multi-layer doping growth, and in particular, it concerns a process of forming a variable structure with mix control ($sp^3/sp^2$ ratio) to obtain a large spectrum energy gap for multifunction photovoltaic and thermal solar cells and other applications.

In recent years, amorphous Diamond Like Carbon (a:DLC, or a-C:H) films have been developed. a:DLC films are easier to deposit on large substrate areas (such as plastic), at low temperature, as compared to CVD diamond-like carbon (DLC) films. The unique properties of a:DLC films are similar to those of single crystal bulk diamonds, including: high hardness, low friction coefficient, chemical inertness, infrared transparency, high electrical resistivity, and smoothness; make them suitable to many applications.

As conventional energy sources may be depleted in the future, meeting the increasing world energy demand will certainly involve increased use of solar energy. Therefore, solar cell research has been accelerated in recent years. Although silicon and compound-semiconductor-based solar cells have dominated the market for the last few decades, low-cost, stable and highly efficient solar cells are yet to be commercially realized due to high material and production costs. However, with the emergence of carbon semiconductor materials, the situation is expected to change. Carbon is readily available in nature. Carbon exhibits outstanding properties such as: chemical inertness; high hardness; high thermal conductivity; high dielectric strength, and infrared (IR) optical transparency. Carbon atoms in a:DLC films may have three different atomic coordinates: The $sp^3$ (tetrahedral or aliphatic), or "sp3" hereinbelow and in the claims which follow, is the typical type of bond for diamond, $sp^2$ (trigonal or aromatic) or "sp2" hereinbelow and in the claims which follow, typical for graphite, and $sp^1$ (linear or acetylenic) or "sp1" hereinbelow, typical for amorphous carbon.

The interesting and unique feature of carbon is that properties such as those noted above can be tuned over an unusual wide range from that of conductor graphite (~0.0 eV) to that of insulating diamond (~5.5 eV) by varying the ratio of sp3 and sp2 hybridized bonds. Hence carbon has attracted the attention of the researchers for its application in solar or photovoltaic (PV) cells. Carbon-based heterostructures such as metal insulator semiconductor (MIS) diodes, Scottky diodes, metal insulator semiconductor field effect transistor, heterojunction diodes, and photovoltaic cells on silicon have already been reported; thereby indicating the potential of carbon materials in electro-optic devices. However, relatively few publications are available on the PV properties of C/Si hetero-structures. It is worth noting that virtually all the researchers working with carbonaceous photovoltaic cells reported the overall photoresponse of their cells. But the separation of respective contributions of carbon and silicon in a C/Si PV cell is yet to be realized. At present, there is a need to advance work on the spectral photoresponse characteristics of C/Si heterostructures and to visualize the contribution of C and Si separately to understand the nature and improve the characteristics for the practical implementation of a:DLC-based PV cells.

Previous studies, such as Aisenberg, S., Kimock, F. M., Mater. Sci. Forum, 52-53, (1988), 1, incorporated herein by reference, show that the energy of the carbon species generated by various preparation methods is different and plays an important role in controlling the sp3/sp2 ratio. Also It is recognized that the population concentrations of sp3 and sp2 bonds are also dependent on different kinds of precursor materials, which dictate the sp3/sp2 ratio of a:DLC structures films. Hence the properties of thin carbon films depend on the method of deposition, deposition parameters and precursor materials used.

There are a number of prior art dealing with the use of amorphous carbon and/or diamond-like carbon layered structures and their fabrication, among them: U.S. Pat. Nos. 6,078,133 (Menu et al.); 7,214,600 (Won et al.); 5,206,534 (Birkle et al.); and 5,366,556 (Prince et al.), incorporated herein by reference. In addition US Patent publications US2007/0042667 and US2006/0078677, herein incorporated by reference, also deal with diamond-like carbon structures and devices. While these prior art touch on many aspects concerning overall fabrication and some precursor details, detailed control of the sp3 and sp2 bonding levels (and, as a result, the sp3/sp2 ratio) is not disclosed.

An additional parameter making carbon films suitable candidates for PV cells is activation energy. Studies, such as J. Robertson, Adv. Phys., 35 (1986), 317 and C. Benndorf, M Grischke, A. Brauer and F. Thieme, Surf. Coat. Technol., 36 (1988), 171, both incorporated herein by reference, for a:DLC films (such as those used in PV cells) show that a deposited doped a:DLC film increases activation energy as compared with undoped film. Study of activation energy reveals that the Fermi level of the carbon film moves from the valence band edge to near the conduction band edge through the mid-gap. The Tauc gap, and conductivity are also influenced with film doping.

Ingram et al. in U.S. Pat. No. 5,562,781, herein incorporated by reference, describes a PV cell comprising a plurality film layers, at least one of the layers being a semiconductor film of amorphous hydrogenated carbon. PIN junctions are formed of films; all made of amorphous, hydrogenated carbon and vary only by dopant levels without each PIN junction. There are variations in band gap from one PIN junction to the next in order that the photovoltaic effect in each PIN junction will be caused by a different portion of the spectrum of light. Ingram describes an arc-discharge deposition technique, which apparently spans various stages in fabrication and he refers to conventional doping to control material properties.

There is therefore a need to for better and/or novel control of the sp3/sp2 ratio and utilizing doping in a:DLC films to fabricate improved photovoltaic cells.

SUMMARY OF THE INVENTION

The present invention is a method and device of amorphous diamond like carbon multi-layer doping growth, and in particular, it concerns a process of forming a variable structure with mix control ($sp^3/sp^2$ ratio) to obtain a large spectrum energy gap for multi-junction photovoltaic cells and other applications.

According to the teachings of the present invention there is provided, a method of a:DLC multi-layer doping growth comprising the steps of: forming a plurality of a:DLC layers in one process, thereby creating a plurality of successively connected PIN junctions, starting from a first junction and ending in a last junction, respective PIN junctions having p-type, n-type, and intrinsic layers; varying the sp2/sp3 ratio of at least the respective p-type and n-type layers and doping with at least silver to enhance electron mobility in respective PIN junctions; and connecting the plurality of a:DLC layers between electrodes at the first side and the second side to create a device having optimized spectral response to being oriented to a light source. Preferably, the sp3/sp2 ratio is varied in a:DLC layers with the ratio ranging from between substantially 4.0 eV or more in a:DLC layers closest to the light source to substantially 0.60 in a:DLC layers furthest from the light source. Most preferably, doping of a:DLC layers with at least silver is performed to yield a controlled photovoltaic response from the first junction to the last junction. Typically, wherein the optimized spectral response yields optimized energy efficiency of the device. Most typically, the optimized spectral response further comprises focusing incident light onto the device. Preferably, the device is a photovoltaic cell. Typically the device is part of an integrated circuit. Most typically, the device is a solar cell.

There is further provided an a:DLC multi-layer device comprising: a plurality of a:DLC layers formable in one process, the layers further comprising a plurality of successively connected PIN junctions, having a first junction and a last junction, and respective PIN junctions having p-type, n-type, and intrinsic layers; the respective p-type and n-type layers having a varying sp3/sp2 ratio and having doping with at least silver and enhanced electron mobility in respective PIN junctions; the a:DLC layers connectable between electrodes at the first side and the second side, comprising a device having optimized spectral response when orientable to a light source. Preferably the sp3/sp2 ratio variable from substantially 4.0 eV or more in a:DLC layers closest to the light and to substantially 0.60 in a:DLC layers furthest from the light source. Most preferably, the a:DLC layers are dopeable with at least silver to yield a controlled photovoltaic response from the first junction to the last junction. Typically, incident light is focusable upon the device to further optimize spectral response of the device. Most typically, the device is a solar cell. Preferably, the device is part of an integrated circuit.

There is further provided a method of enhanced a:DLC multi-layer doping growth comprising the steps of: forming a first plurality of a:DLC layers in one process, thereby creating a plurality of successively connected PIN junctions, starting from a first junction and ending in a last junction, respective PIN junctions having p-type, n-type, and intrinsic layers; varying the sp3/sp2 ratio of at least the respective p-type and n-type layers and doping with at least silver to enhance electron mobility in respective PIN junctions; fabricating an second plurality of a:DLC layers according to steps a and b; connecting the first plurality of a:DLC layers between electrodes at the layers' respective first side and second side and connecting the second plurality of a:DLC layers between electrodes at the layers' respective first side and second side; and connecting the respective electrodes of the respective second sides of the two pluralities of a:DLC layers to create a device having optimized spectral response to being oriented to a light source and an optimized thermal response. Preferably, the optimized spectral response further comprises focusing incident light onto the device. Most preferably, the device is a solar cell. Typically, the device is part of an integrated circuit.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1:
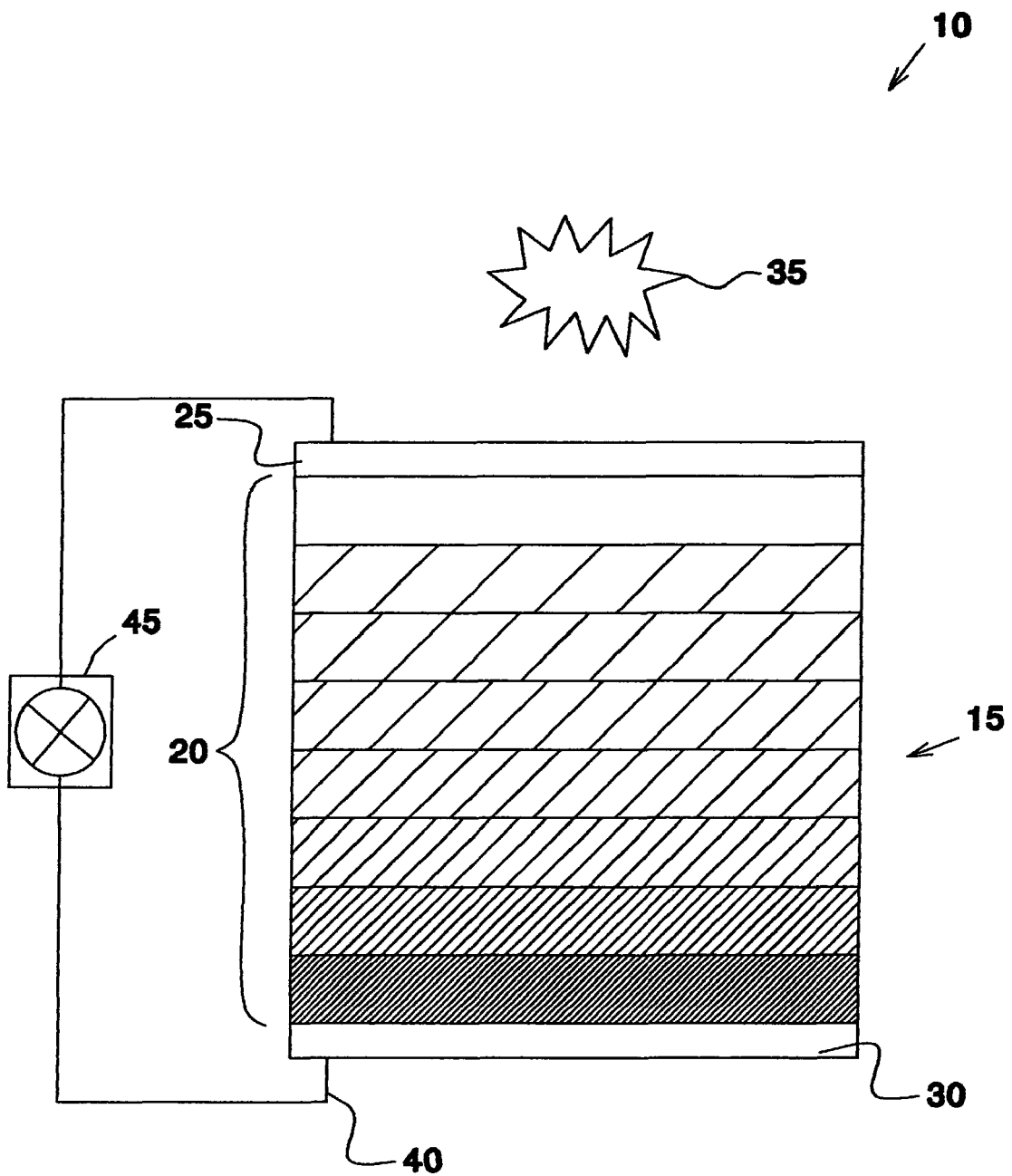
FIG. 1 is a schematic diagram of a device 10, with a plurality of films 15, in accordance with an embodiment of the current invention.

The present invention is a method and device of amorphous diamond like carbon multi-layer doping growth, and in particular, it concerns a process of forming a variable structure with mix control ($sp^3/sp^2$ ratio) to obtain a large spectrum energy gap for multi-junction photovoltaic cells and other applications.

The principles method for amorphous diamond like carbon multi-layer doping growth according to the present invention may be better understood with reference to the drawings and the accompanying description.

In the specification and the claims hereinbelow, the following terms are defined.

"Amorphous Diamond-like carbon" (alternatively "a:DLC" and/or "a-C:H") is intended to mean a hydrogenated carbonaceous material having carbon atoms as the majority element, with a substantial amount of such carbon atoms bonded in distorted tetrahedral coordination. a:DLC can typically be formed by PVD processes, although CVD or other processes could be used such as vapor deposition processes. Notably, a variety of other elements can be included in the DLC material as either impurities, or as dopants, including without limitation, hydrogen, sulfur, phosphorous, boron, nitrogen, silicon, and tungsten, among others.

"sp3/sp2 ratio" is intended to mean the ratio between complete diamond structure versus complete graphite structure of the a:DLC material, with the terms "sp3" and "sp2" defined hereinabove.

"One process" is intended to mean a process that takes place substantially concomitantly in one processing tool—as opposed to a process that entails multiple processing tools and/or iterative steps involving one or more processing tools over a non-concomitant time period. In most cases, one process offers advantages in time and cost, among other advantages, as compared to similar procedures involving many processes.

"Work function" is intended to mean the amount of energy, typically expressed in eV, required to cause electrons in the highest energy state of a material to emit from the material into a vacuum space. Thus, a material such as copper having a work function of about 4.5 eV would require 4.5 eV of energy in order for electrons to be released from the surface into a theoretically perfect vacuum at 0 eV.

"Thermoelectric conversion" relates to the conversion of thermal energy to electrical energy or of electrical energy to thermal energy, or flow of thermal energy. Further, in the context of embodiments of the present invention, an a:DLC employed in a photovoltaic cell typically operates under thermionic emission. As discussed hereinbelow, thermionic emission is a property wherein increased electron emission is achieved from a material with increases in temperatures. Materials such as a:DLC exhibit thermionic emission at temperatures far below that of most others materials. For example, while many materials tend to exhibit substantial thermionic emission or temperature related effects in emission properties at temperatures over about 1,100 degrees C., a:DLC exhibits increases in emission at temperature changes near room temperature up to 1000 degrees C. or more. A thermionic material such as a:DLC can be useful at temperatures from below room temperature to about 300 degrees C.

Reference is presently made to FIG. 1, which is a schematic diagram of a device 10, such as a PV cell or solar cell, having a plurality of films 15, in accordance with an embodiment of the present invention. The plurality of films comprises a number of PIN junctions 20, formed by three respective a:DLC thin films (trios)—not shown in the figure—per PIN junction; the layers deposited successively upon one another. In an embodiment of the current invention, the PIN trio closest to electrode layer 25 (indium tin oxide) ITO is fabricated from an a:DLC layer with a high sp3/sp2 ratio, as described further hereinbelow. In contrast, the PIN trio closest to electrode layer 30 is fabricated with an a:DLC layer having a low sp3/sp2 ratio, as described further hereinbelow. Electrode layer 30 grows on substrate—not shown in the figure. PIN junctions 20 are sandwiched between and in complete electrical contact with the upper and lower electrodes. In other embodiments of the current invention, either or both of electrodes 30 and 25 may be fabricated from a ITO layers, as known in the art. Device 10 is exposed to a light source 35, such as, but not limited to sunlight. Upper electrode layer 25 is typically oriented closest to the light source and the upper electrode is fabricated with a high transparency to the incident light from the light source. Leads 40 are electrically connected to the electrodes and are connected to a load 45, such as, but not limited to a: electrical storage device, another electrical circuit, or an other electrical/electronic device normally receiving power.

The PIN junction trios, comprising a:DLC layers have a number of important properties, as described hereinbelow. All of the layers described herein have typical thicknesses as known in the art, approximately ranging from about 1 micron to about 0.1 micron, although thicknesses larger and smaller than this range are also possible.

Table 1.1, herein below, from Aisenberg, S., Kimock, F. M., Mater. Sci. Forum, 52-53, (1988), 1, incorporated herein by reference, shows several key physical characteristics of the various classes of amorphous and crystalline carbon materials. Embodiments of the current invention include a:DLC layers having large band gaps (>4 eV), which serve to improve thermal conductivity and increased surface protection of a solar cell

TABLE 1.1

Key physical characteristics of several types of carbon materials [after Aisenberg et al.]

| (a) Type of carbon | Density (g/cm$^3$) | Optical gap (eV) | Hardness (Gpa) | sp3 (%) | H (%) |
|---|---|---|---|---|---|
| Graphite | 2.27 | 0.0 | — | 0.0 | 0.0 |
| Glassy carbon | 1.3-1.6 | 0.0 | 2-3 | ~0 | ~0 |
| Evaporation | 1.9-2.0 | 0.4-0.7 | 2-5 | <5 | <5 |
| Sputtered C on Si (77K) | 2.2-2.6 | 0.6-0.9 | 10 | 5-10 | <5 |
| i-C | 2.9-3.4 | 2.5 | 100 | >85 | <5 |
| Hard a:DLC | 1.6-2.0 | 1.2-1.6 | 10-30 | 40-50 | 30-50 |
| Soft a:DLC | 0.9-1.2 | 1.6-4.0 | <5 | 50-80 | 50-60 |
| Polyethylene | 0.9 | 6.0 | 0.01 | 100 | 66 |
| Diamond | 3.52 | 5.5 | 100 | 100 | 0.0 |

Typically, a:DLC layers 20 are selectively fabricated with the highest sp3/sp2 ratio in layers closest to the light source and with the lowest sp3/sp2 ratio furthest from the light source. In this manner, device 10 has an optimized response to the light source in that only longer wavelength light is absorbed and converted to electrical current in the PIN junction closest to the light source and so that shorter wavelength light passes through the layers closest to the light source and onward to subsequent layers, where the light is selectively absorbed and converted to electrical current. Selectively forming PIN junctions 20 having a:DLC layers with sp3/sp2 ratios ranging from about 4.0 eV or more (layers associated with more diamond-like properties, including high transparencies) to about 0.5 eV (layers associated with more graphite-like properties) allows device 10 to have an optimized spectral response.

Furthermore, one process may be used in embodiments of the current invention to form PIN junctions 20 with a:DLC layers in a near-continuous fashion, based upon hard and soft a-C:H. Fabrication of device 10 may be done upon glass substrates, by growing conductive electrode layer 30 from solid graphite and then by fabricating all of the a:DLC layers above the electrode in one process. In this way, a:DLC layers may be the equivalent of one continuous film with varying properties, expressed by controlled and varying sp3/sp2 ratios and by appropriate doping (to create n-doped, p-doped, and intrinsic layers, as known in the art) as described herein below, in the film, moving form the lower electrode to the upper electrode.

In embodiments of the current invention, Ag (silver) may be incorporated as a doping material in a:DLC layers 20, to reduce recombination and increase lifetime of carriers, thereby influencing a:DLC electronic properties. This phenomenon was reported in the following sources, incorporated herein by reference: H. Biederman, L. Martinu, D. Slavinska, I. Chudacek, Pure & Appl. Chem., 60 (1988), 607; H. Biederman, Z. Chmel, A. Fejfar, M. Misina, J. Pesicka, Vacuum, 40 (1990); P. Sheng, Y. Abeles, P. Arie, Phys. Review Letters, 31 (1977), 44; and D. Babonneau, T. Cabioc'h, A. Naudon, J. C. Girard, M. F. Denanot, Surface Science, 409 (1998), 358. While there are several other doping materials for a:DLC, such as Na, I, and B, all of them produce p-type doping. Thus, an efficient idea is to dope a:DLC, which is a p-type, to obtain an n-type a:DLC required for making the device based on p-n junctions (e.g., diodes and transistors). Additional advantages of Ag doping include: improved doping uniformity, decreased resistivity (the current ratio $R=(I_L-I_d)/I_L$ ($I_d$ current in dark) and under light ($I_L$)); additional effect of negative photoconductivity; and energy gap improvement/increase of solar cell current.

Another secondary advantage related to Ag doping of a:DLC is for surface-enhanced Raman spectroscopy—in offline process control. This is based on the fact that a small percentage of diamond content cannot be distinguished in the presence of graphite, because the scattering cross-section for graphite is 50 times greater than it is for diamond. However, if a very small amount of silver is sputtered onto the surface of an a:DLC film, the Raman lines characteristic of diamond are enhanced dramatically.

In embodiments of the present invention, an Ag-a:DLC film may be grown on a substrate (not shown in the figure) of silicon, glass, plastic, sapphire substrate, and any other suitable material by an RF sputtering method, where a mixture of $Ar+CH_4$ gas is introduced into a chamber with an Ag plate as one of the electrodes. Alternatively, the Ag source can be introduced in a different form, such as a gaseous form.

One deposition process for a:DLC films was using a RF (13.56 MHz) glow discharge with a hydrocarbon ($CH_4$) or a hydrocarbon mixture with other gases or doping gas. In one experiment, deposition was made after evacuating the chamber to a pressure $p \leq 1.33 \times 10^{-4}$ Pa. The dimensions of the vacuum chamber were: 50 cm. diameter and 80 cm. in height. The diameter of the electrode was 20 cm with a 8-10 cm spacing between anode and cathode. The electrode also served as a substrate holder and was water-cooled. The power electrode (so-called cathode) was RF self-biased negatively at a voltage $V_b$ relative to ground. Thus, it was subjected to ion bombardment (for example, by $C^+$).

The $CH_4$ pressure admitted between 2-10 milli torr and a discharge power varied from 50 to 400 W (self bias from −400 to −1000V). The purity of the admitted gases in the chamber was more than 99.99% to obtain a:DLC films with high purity and good adhesion, After particles were filtered, mass flow control (MFC) was used to control gas entry into chamber.

Composite films grown on electrically grounded or floating substrates are subjected to electron and ion bombardment. Under usual discharge conditions, the floating or grounded substrate is negative against a plasma potential (about 10V drop). Positive ion bombardment with this average energy is of special importance as it enhances the plasma polymerization via production of surface free radicals. In the case of an ordinary planar magnetron, the potential drop is lower and most of the electrons are trapped by the tunnel magnetic field. The situation changes if an increased $U_B$ acts on the substrate via capacitive coupling of an independent RF generator or by splitting the original RF power. A simple solution is to place the substrate on the excitation electrode, for instance, an Ag plate in deposition plasma When $CH_4$+Ar gases are used, competitive reactive Ar ions etch the substrate, removing Ag atoms and simultaneously with the decomposition of $CH_4$, a:DLC-doped with Ag films are generated. Increasing Ar partial pressure in the process increases the Ag concentration in films.

For deposition of Ag in a:DLC films a vacuum chamber is used where the Ag foil is placed as one of the electrodes and substrates as a second electrode. The ratio of flow rate of gases is controlled by mass flow control (MFC). The ranges of Ar partial pressure [%,] relative to the total pressure of $CH_4$+Ar ($6.7\ 10^{-1}$ Pa), are measured using a Micro Pole Analyzer in the chamber. The Ag doping level is known and gas source precursors or evaporated liquid gas is used.

Figure 2:
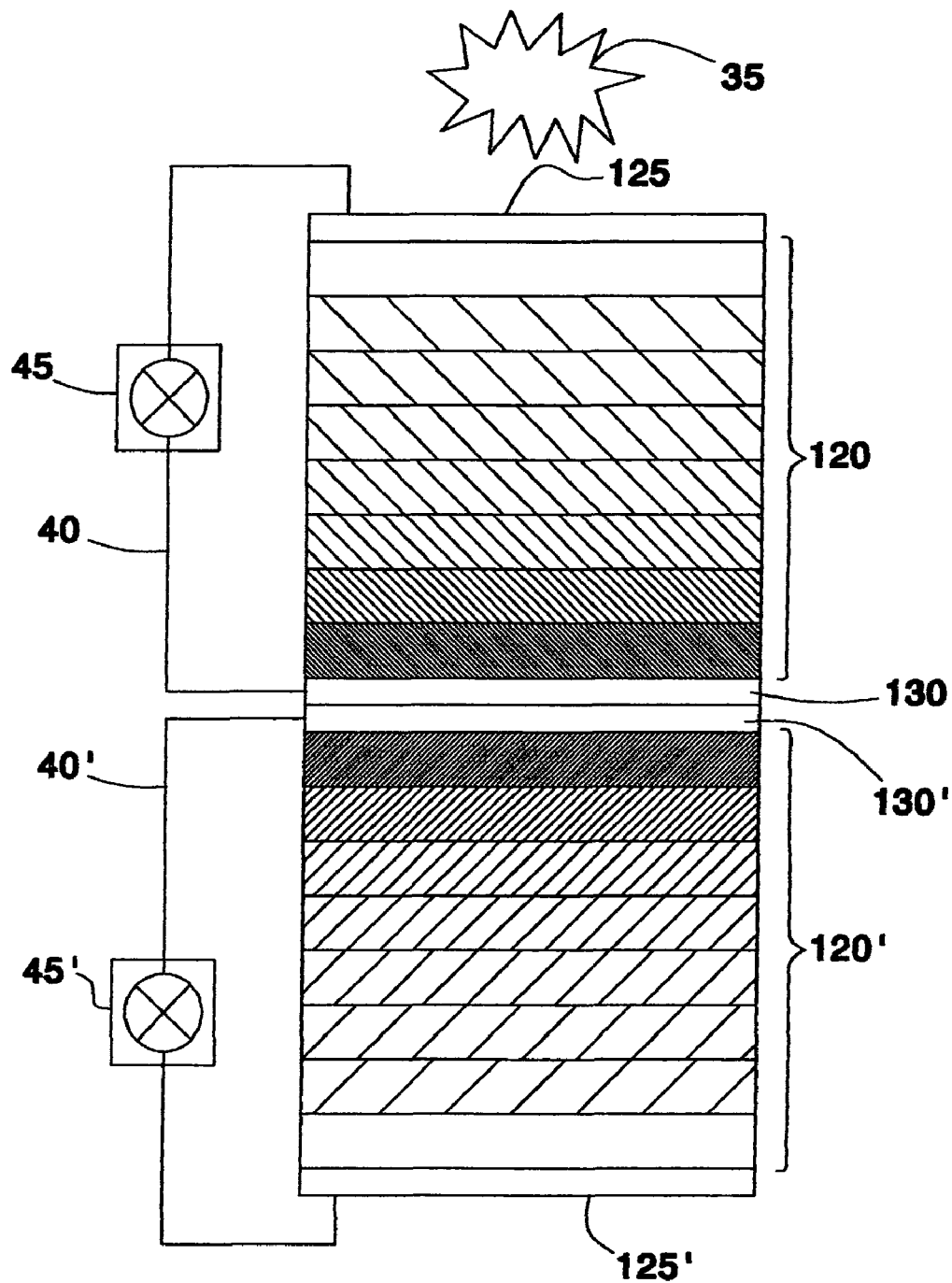
FIG. 2 is a schematic diagram of an enhanced device 100, in accordance with an embodiment of the current invention.

Reference is now made to FIG. 2, which is a schematic diagram of an enhanced device 100, such as a PV cell or solar cell, in accordance with an embodiment of the current invention. Apart from differences described below, enhanced device 100 is generally similar to operation of device 10 as shown in FIG. 1, so that elements indicated by the same reference numerals are generally identical in configuration and operation.

A plurality of films comprises a number of PIN junctions 120 and 120' (similar to PIN junctions 20 as shown in FIG. 1.); upper electrode layers 125 and 125' (similar to upper electrode layer 25 as shown in FIG. 1.), and lower electrode layers 130 and 130' (similar to lower electrode layer 30 as shown in FIG. 1.). In the current figure it can be seen that two devices 10 are configured with their respective lower electrodes in close proximity, although the electrodes are typically insulated from one another (not shown in the figure). One example of such insulation is a non-conducting substrate or, alternatively, it may be a grounding conducting material, serving as a common ground, upon which the enhanced device may be grown.

Leads 40 and 40' and loads 45 and 45' function generally similarly to leads 40 and load 45 shown in FIG. 1). The advantage of enhanced device 100 is that the configuration shown has a:DLC layers optimized in terms of spectral response to light source 35 and in terms of overall thermal management of the device. For example, when light from illumination source 35 is incident on upper electrode 125 and is selectively absorbed in PIN junctions 120, heat is generated, as the device functions as a thermionic device. Generated heat is conducted through PIN junctions 120 and through lower electrodes 130 and 130' to PIN junctions 120', where a portion of the thermal energy generated is converted to electrical energy, recovered by leads 45'. Additionally or alternatively, illumination incident on device 100 may be further absorbed by some or all of PIN junctions 120' to further generate electricity. In embodiments of the current invention, a:DLC layers in PIN junctions 120 and 120' are selectively fabricated in terms of sp3/sp2 ratios, as previously noted, to optimize overall operating performance of device 100.

An additional advantage of using a;DLC with high sp3/sp2 ratios for selective layers is that a:DLC having these high ratio values is highly thermally conductive. This quality may be used advantageously to thermally manage devices 10 and 100 and to enhance their performance in general. Also, the use of thin layers generally aids in overall thermal management of the devices; the thin layers generally offering lower thermal conductivity resistance.

In other embodiments of the current invention, devices 10 and 100 take advantage of a single dichroic mirror which splits the incident light spectrum between two PIN junctions having different absorption bands. This design can be extended to a number of semiconductor converters. A Fresnel lens may be used to collect incident light and direct it into a pyramidal concentrator. The concentrator delivers the light to small dichroic optics, in this case a prism, which divide the input light between solar cells that absorb different spectral bands.

Another embodiment of the current invention is a concentration optic system, using the micro optic components for focusing the light on the edge side of the PIN junctions. An advantage of this principle is that incident light is concentrated upon every PIN junction and that thermal management and device efficiency may be increased.

Embodiments of the current invention, using a:DLC as described hereinabove, may further be applied to conventional and microelectronic integrated circuit fabrication, with or without application of the PIN junctions noted hereinabove. Such applications include, but are not limited to: variable electronic dimmers, detectors and variable light sensors (large spectrum of wavelength in one detector), transistors, capacitors (nano capacitors with variable capacity), variable antifuse, field emission devices, variable resistance assemblies, and an array of protective optics windows having variable electronic, mechanical, and optics qualities, silicon and other photo Volta cell improvements, variable low dielectric constant films for ULSI, protective coating areas with different electronic, mechanic, optic, and morphology properties for magnetic storage disks, optical windows, micro-electromechanical devices (EMs), solid state relays, thermostats for any kind of electronic devices, waveguide sensing systems, medical devices, micro-optical component coating, and MEMS product systems.

It will be appreciated that the above descriptions are intended only to serve as examples, and that many other embodiments are possible within the scope of the present invention as defined in the appended claims.

What is claimed is:

1. A method of a:DLC multi-layer doping growth comprising the steps of:
   (a) forming a plurality of a:DLC layers in one process, thereby creating a plurality of successively connected PIN junctions, starting from a first junction and ending in a last junction, respective PIN junctions having p-type, n-type, and intrinsic layers;

(b) varying the sp3/sp2 ratio of at least the respective p-type and n-type layers and doping with at least silver to enhance electron mobility in respective PIN junctions; and (c) connecting the plurality of a:DLC layers between electrodes at the first side and the second side to create a device having optimized spectral response to being oriented to a light source.

2. The method according to claim 1, wherein the sp3/sp2 ratio is varied in a:DLC layers with the ratio ranging from between substantially 4.0 eV or more in a:DLC layers closest to the light source to substantially 0.60 in a:DLC layers furthest from the light source.

3. The method according to claim 2, wherein doping of a:DLC layers with at least silver is performed to yield a controlled photovoltaic response from the first junction to the last junction.

4. The method according to claim 3, wherein the optimized spectral response yields optimized energy efficiency of the device.

5. The method of claim 4, wherein the optimized spectral response further comprises focusing incident light onto the device.

6. The method according to claim 5, wherein the device is a photovoltaic cell.

7. The method of claim 5, wherein the device is part of an integrated circuit.

8. The method according to claim 5, wherein the device is a solar cell.

9. An a:DLC multi-layer device comprising:
(a) a plurality of a:DLC layers formable in one process, the layers further comprising a plurality of successively connected PIN junctions, having a first junction and a last junction, and respective PIN junctions having p-type, n-type, and intrinsic layers;
(b) the respective p-type and n-type layers having a varying sp3/sp2 ratio and having doping with at least silver to enhance electron mobility in respective PIN junctions;
(c) the a:DLC layers connectable between electrodes at the first side and the second side, comprising a device having optimized spectral response when orientable to a light source.

10. The device of claim 9, having the sp3/sp2 ratio variable from substantially 4.0 eV or more in a:DLC layers closest to the light and to substantially 0.60 in a:DLC layers furthest from the light source.

11. The device of claim 9, wherein the a:DLC layers are dopeable with at least silver to yield a controlled photovoltaic response from the first junction to the last junction.

12. The device of claim 9, wherein incident light is focusable upon the device to further optimize spectral response of the device.

13. The device according to claim 12, wherein the device is a solar cell.

14. The device of claim 12, wherein the device is part of an integrated circuit.

15. A method of enhanced a:DLC multi-layer doping growth comprising the steps of:
(a) forming a first plurality of a:DLC layers in one process, thereby creating a plurality of successively connected PIN junctions, starting from a first junction and ending in a last junction, respective PIN junctions having p-type, n-type, and intrinsic layers;
(b) varying the sp3/sp2 ratio of at least the respective p-type and n-type layers and doping with at least silver to enhance electron mobility in respective PIN junctions;
(c) fabricating a second plurality of a:DLC layers according to steps a and b;
(d) connecting the first plurality of a:DLC layers between electrodes at the layers' respective first side and second side and connecting the second plurality of a:DLC layers between electrodes at the layers' respective first side and second side; and
(e) connecting the respective electrodes of the respective second sides of the two pluralities of a:DLC layers to create a device having optimized spectral response to being oriented to a light source and an optimized thermal response.

16. The method of claim 15, wherein the optimized spectral response further comprises focusing incident light onto the device.

17. The method according to claim 16, wherein the device is a solar cell.

18. The method of claim 16, wherein the device is part of an integrated circuit.

* * * * *